(12) United States Patent
Masuhara et al.

(10) Patent No.: US 8,391,346 B2
(45) Date of Patent: Mar. 5, 2013

(54) DATA SIGNAL QUALITY EVALUATION APPARATUS

(75) Inventors: Keita Masuhara, Atsugi (JP); Tadanori Nishikobara, Atsugi (JP)

(73) Assignee: Anritsu Corporation, Atsugi-Shi (JP)

( * ) Notice: Subject to any disclaimer, the term of this patent is extended or adjusted under 35 U.S.C. 154(b) by 77 days.

(21) Appl. No.: 13/084,861

(22) Filed: Apr. 12, 2011

(65) Prior Publication Data

US 2011/0268170 A1   Nov. 3, 2011

(30) Foreign Application Priority Data

Apr. 28, 2010   (JP) .................................. 2010-103632
Apr. 28, 2010   (JP) .................................. 2010-103633
Apr. 28, 2010   (JP) .................................. 2010-103634

(51) Int. Cl.
*H04B 3/46* (2006.01)
(52) U.S. Cl. ......... 375/228; 375/225; 375/268; 375/371
(58) Field of Classification Search .................. 375/228, 375/225, 268, 371
See application file for complete search history.

(56) References Cited

U.S. PATENT DOCUMENTS

| 6,806,877 B2 * | 10/2004 | Fernando ...................... 345/440 |
| 2009/0122852 A1 * | 5/2009 | Smith et al. ................... 375/228 |
| 2009/0245339 A1 * | 10/2009 | Obata ........................... 375/226 |

FOREIGN PATENT DOCUMENTS

JP   2010-061207 A   3/2010

* cited by examiner

*Primary Examiner* — Kabir A Timory
(74) *Attorney, Agent, or Firm* — Pearne & Gordon LLP

(57) ABSTRACT

When an operating unit is operated to designate an arbitrary width W and an arbitrary angle θ, a mask region limiting unit limits the effective range of a reference mask set for compliance measurement of the data signal to be evaluated by a reference mask setting unit to the range determined by the designated width and angle and displays the limited effective range on a display unit. When the mask region limiting unit limits the effective range of the reference mask, a quality evaluating unit performs compliance measurement and quality evaluation for the limited effective range in operative association with the limitation of the effective range.

12 Claims, 14 Drawing Sheets

DATA SIGNAL QUALITY EVALUATION APPARATUS

BACKGROUND OF THE INVENTION

1. Field of the Invention

The present invention relates to a technique for acquiring the waveform information of binary data signals of 0 and 1 treated by various kinds of digital apparatuses or transmission systems and effectively evaluating the quality of the eye pattern of the data signals.

2. Description of Related Art

In order to evaluate the digital apparatus or the transmission system, the following methods have been generally used: a method of measuring the bit error rate of the data signal output from an object to be evaluated; and a method of intuitively grasping the degree of fluctuation (jitter) in the phase or amplitude of the data signal while observing the waveform.

As the method of intuitively observing the fluctuation in the phase or amplitude of the data signal with the waveform, a method of displaying an eye pattern has been used.

The eye pattern is obtained by displaying the bit waveforms of the data signal on the same time axis so as to overlap each other. For example, for a data signal x(t) of an NRZ format shown in (a) of FIG. 11, waveform data (H1, H2, ... ) corresponding to a predetermined number of bits (2 bits) are acquired in synchronization with a trigger signal ((b) of FIG. 11) with a period that is N times the reference bit period Tc of the data signal x(t) and the acquired waveform data overlap each other on the same time axis. In this way, an eye pattern Pe shown in (c) of FIG. 11 is obtained. The actual eye pattern is obtained by displaying the positions corresponding to the size of each waveform data item with points. In FIG. 11, the region in which the points of the waveform data are more likely to be present is hatched and all of the points forming the eye pattern are not included in the hatched portion (which is the same as that in the following description).

The length La of a region A of the obtained eye pattern Pe in the time axis direction depends on the degree of the fluctuation in the phase of the data signal x(t) (the thickness of a level transition portion of data) and the length Lb of the region A in the voltage axis direction depends on the degree of the fluctuation in the amplitude of the data signal (the thickness of a line extending in the time axis direction).

Therefore, the relationship between the eye pattern of the data signal x(t) and the expansion of the region A surrounded by the eye pattern is quantitatively measured to evaluate the quality of the data signal.

As one of the evaluation methods, there is a test method that prepares a mask M that has a polygonal shape (here, a hexagonal shape) corresponding to the shape of the region surrounded by the eye pattern Pe and has a size determined by the bit rate or design amplitude of the data signal and a margin, fixes the mask M to a predetermined position in the vicinity of the center of the region surrounded by the eye pattern, and counts the number of points of the waveform data forming the eye pattern in the mask, as shown in FIG. 12 (mask compliance measurement).

It is defined that, among a total of P points of the waveform data forming the eye pattern, up to Q points are allowed to be present in the mask. When the number of actual points determined to be in the mask is equal to or less than Q, the test result OK (success) is output. When the number of actual points determined to be in the mask is more than Q, the test result NG (failure) is output.

As another evaluation method, there is a test method that prepares a mask M that has a polygonal shape (here, a hexagonal shape) corresponding to the shape of the region surrounded by the eye pattern Pe and has a size determined by the bit rate or design amplitude of the data signal and a margin is used, fixes the mask M to a predetermined position in the vicinity of the center of the region surrounded by the eye pattern, counts the number of points of the waveform data forming the eye pattern while sequentially enlarging the mask M from a standard size, and tests the margin of the quality of the data signal for the mask with the standard size from the relationship between the count value and the enlargement ratio of the mask (margin measurement).

It is defined that, among a total of P points of the waveform data forming the eye pattern, up to Q points of the waveform data are allowed to be present in the mask. From the test result, the enlargement ratio at which the number of points in the mask is more than Q is determined.

An example of the technique for evaluating the quality of the data signal on the basis of the relationship between the eye pattern and the mask is disclosed in the following JP-A-2010-061207.

SUMMARY OF THE INVENTION

However, in many cases, jitter occurs in the data signal so as to lean to a falling portion or a rising portion of the data signal. In some cases, the rising portion or the falling portion needs to be intensively or temporarily measured in a set range of the entire range of the mask. In addition, similarly, in some cases, in the existing range of the mask set to the data signal, a fluctuation in the amplitude direction rather than in the time axis direction needs to be intensively or temporarily measured, or a fluctuation in the time axis direction rather than in the amplitude direction needs to be intensively or temporarily measured.

However, in general, the apparatus according to the related art provides only a method of selectively using the mask that is registered for the data signal in advance. In addition, the apparatus according to the related art has a function of registering a mask with an arbitrary shape, but does not have a function of registering many parameters for specifying the shape in advance and selecting and using the mask before measurement. During measurement using the reference mask, it is difficult to intensively or temporarily perform the measurement in a specific direction within the range of the mask.

The invention has been made in view of the above-mentioned problems and an object of the invention is to provide a data signal quality evaluation apparatus that designates a width and a direction to a reference mask set to a data signal and performs measurement using a region limited by the designated width and direction as an effective region, thereby easily performing measurement in the direction desired by the measurer.

Another object of the invention is to provide a data signal quality evaluation apparatus that easily measures a margin in the direction desired by the measurer.

In the margin measurement, as the number of waveform data items forming the eye pattern increases, dispersion due to jitter or a fluctuation in amplitude increases, which results in an increase in the number of display points in the mask region.

That is, the measurement result depends on the number of waveform data items forming the eye pattern. Therefore, in general, for example, as a reference value, a total of 100000 waveform data items are needed to display the eye pattern in the range of 2 UI and the margin measurement is performed on the eye pattern formed by the reference value. Then, the limit of the number of waveform data items in the enlarged mask region is counted to perform evaluation.

However, since high-speed data sampling is generally performed by an equivalent time sampling method, it takes a long time to acquire a large amount of data.

When the quality of the data signal is low, in some cases, the number of data items is more than the limit value even when a small amount of data is sampled. It is inefficient to acquire 100000 data items from the low-quality data signal and perform margin measurement.

Another object of the invention is to provide a data signal quality evaluation apparatus capable of effectively performing margin measurement and preventing the unnecessary acquisition of data from a low-quality data signal.

In order to achieve the objects, according to a first aspect of the invention, a data signal quality evaluation apparatus includes: a waveform data acquiring unit (21) that performs sampling on a data signal to be evaluated which has a desired bit rate and a desired amplitude to acquire waveform data of the data signal; a display unit (40); an operating unit (50); an eye pattern display unit (31) that displays an eye pattern of the data signal on the display unit on the basis of the waveform data acquired by the waveform data acquiring unit; a mask setting unit (32) that sets a mask which has a polygonal shape substantially similar to the shape of a region surrounded by the eye pattern of the data signal and has a size corresponding to the bit rate and amplitude of the data signal as a reference mask for evaluating the quality of the data signal; a mask display unit (33) that displays the reference mask set by the mask setting unit at a desired position which overlaps the region surrounded by the eye pattern of the data signal; a quality evaluating unit (34) that counts the number of display points in the region of the reference mask among the display points of the waveform data forming the eye pattern, evaluates the quality of the data signal on the basis of the count value, and displays the evaluation result of the quality on the display unit; and a mask region limiting unit (35) that limits the effective range of the reference mask to a range determined by an arbitrary width and angle designated by an operation of the operating unit and displays the limited effective range on the display unit. The quality evaluating unit performs quality evaluation on the limited effective range.

According to a second aspect of the invention, in the data signal quality evaluation apparatus according to the first aspect, the mask region limiting unit may use an overlap range between a region interposed between two parallel straight lines which are equidistant from the center of the reference mask and are inclined at a predetermined angle and the region of the reference mask as the effective range.

According to a third aspect of the invention, in the data signal quality evaluation apparatus according to the first or second aspect, the mask setting unit may set a mask that is enlarged at an arbitrary enlargement ratio from the reference mask. The quality evaluating unit may count the number of display points in the effective range based on the enlarged mask, measure the margin of the data signal for the reference mask on the basis of the number of display points in the enlarged mask and the number of display points in the reference mask, and display the measurement result of the margin on the display unit.

In order to achieve the objects, according to a fourth aspect of the invention, a data signal quality evaluation apparatus includes: a waveform data acquiring unit (21) that performs sampling on a data signal to be evaluated to acquire waveform data of the data signal; a display unit (40); an eye pattern display unit (31) that displays an eye pattern of the data signal on the display unit on the basis of the waveform data acquired by the waveform data acquiring unit; a mask setting unit (32) that sets a mask which has a polygonal shape substantially similar to the shape of a region surrounded by the eye pattern of the data signal and has a size corresponding to the bit rate and amplitude of the data signal as a reference mask for evaluating the quality of the data signal; a mask display unit (33) that sequentially displays the reference mask set by the mask setting unit and a mask enlarged at an arbitrary enlargement ratio at a desired position which overlaps the region surrounded by the eye pattern of the data signal; and a quality evaluating unit (34) that counts the number of display points in the effective range based on the reference mask and the number of display points in the effective range based on the enlarged mask, measures the margin of the data signal for the reference mask on the basis of the number of display points in the reference mask and the number of display points in the enlarged mask, and displays the measurement result of the margin on the display unit. The quality evaluating unit has a real-time measurement mode (34b) in which, whenever the waveform data acquiring unit acquires the minimum number of data items required to display the eye pattern with a predetermined time width, the margin of the acquired data is measured.

According to a fifth aspect of the invention, in the data signal quality evaluation apparatus according to the fourth aspect, the quality evaluating unit may store the measurement result of the margin while repeatedly performing the real-time measurement, thereby acquiring the measurement result of the margin corresponding to a predetermined number of data items in the measurement of the margin.

In order to achieve the objects, according to a sixth aspect of the invention, a data signal quality evaluation method includes: a waveform data acquiring step (S101) of performing sampling on a data signal to be evaluated which has a desired bit rate and a desired amplitude to acquire waveform data of the data signal; an eye pattern display step (S102) of displaying an eye pattern of the data signal on the basis of the waveform data acquired in the waveform data acquiring step; a mask setting step (S103) of setting a mask which has a polygonal shape substantially similar to the shape of a region surrounded by the eye pattern of the data signal and has a size corresponding to the bit rate and amplitude of the data signal as a reference mask for evaluating the quality of the data signal; a mask display step (S104) of displaying the reference mask set in the mask setting step at a desired position which overlaps the region surrounded by the eye pattern of the data signal; a counting step (S105) of counting the number of display points in the region of the reference mask among the display points of the waveform data forming the eye pattern; a quality evaluating step (S106) of evaluating the quality of the data signal on the basis of the count value and displaying the evaluation result of the quality; and a mask region limiting step (S107) of designating an arbitrary width and an arbitrary angle to the effective range of the reference mask, limiting the effective range of the reference mask to a range determined by the determined width and angle, and displaying the limited effective range. The quality evaluating step performs the quality evaluation on the limited effective range.

According to a seventh aspect of the invention, in the data signal quality evaluation method according to the sixth aspect, the mask region limiting step may use an overlap range between a region interposed between two parallel straight lines which are equidistant from the center of the reference mask and are inclined at a predetermined angle and the region of the reference mask as the effective range.

According to an eighth aspect of the invention, the data signal quality evaluation method according to the sixth or seventh aspect may further include an enlargement ratio setting step (S108) of setting a mask that is enlarged at an arbitrary enlargement ratio from the reference mask. The quality evaluating step may be a margin measuring step (S109) of counting the number of display points in the effective range based on the enlarged mask, measuring the margin of the data signal for the reference mask on the basis of the number of display points in the enlarged mask and the number of display points in the reference mask, and displaying the measurement result of the margin.

In order to achieve the objects, according to a ninth aspect of the invention, a data signal quality evaluation method includes: a waveform data acquiring step (S101) of performing sampling on a data signal to be evaluated which has a desired bit rate and a desired amplitude to acquire waveform data of the data signal; an eye pattern display step (S102) of displaying an eye pattern of the data signal on the basis of the waveform data acquired in the waveform data acquiring step; a mask setting step (S103) of setting a mask which has a polygonal shape substantially similar to the shape of a region surrounded by the eye pattern of the data signal and has a size corresponding to the bit rate and amplitude of the data signal as a reference mask for evaluating the quality of the data signal; a mask display step (S104) of sequentially displaying the reference mask set in the mask setting step and a mask enlarged at an arbitrary enlargement ratio at a desired position which overlaps the region surrounded by the eye pattern of the data signal; a counting step (S105) of counting the number of display points in the region of the reference mask among the display points of the waveform data forming the eye pattern; an enlargement ratio setting step (S108) of setting a mask that is enlarged at an arbitrary enlargement ratio from the reference mask, instead of the reference mask, a margin measuring step (S109) of counting the number of display points in the effective range based on the enlarged mask and the number of display points in the effective range based on the enlarged mask, measuring the margin of the data signal for the reference mask on the basis of the number of display points in the reference mask and the number of display points in the enlarged mask, and displaying the measurement result of the margin; a predetermined unit data acquiring step (S111) of acquiring the minimum number of data items required to display the eye pattern with a predetermined time width; and a real-time measurement mode (S112) that measures the margin of the acquired data whenever the minimum number of data items required to display the eye pattern with the predetermined time width is acquired.

According to a tenth aspect of the invention, the data signal quality evaluation method according to the ninth aspect may further include a margin measurement result storage step (S113) of storing the measurement result of the margin while repeatedly performing the real-time measurement. The quality evaluating step may include a predetermined number measuring step (S114) of acquiring the measurement result of the margin corresponding to a predetermined number of data items in the measurement of the margin.

As such, the data signal quality evaluation apparatus according to the invention can limit the effective region of the reference mask set to the data signal to the range determined by an arbitrarily designated width and angle. Therefore, it is not necessary to input the detailed shape data of a new mask and it is possible to intensively or temporarily perform measurement in the direction desired by the measurer and improve the efficiency of measurement.

In addition, the data signal quality evaluation apparatus according to the invention can limit the effective region of the reference mask set to the data signal to the range determined by an arbitrarily designated width and angle. Therefore, it is not necessary to input the detailed shape data of a new mask and it is possible to intensively or temporarily measure a margin in the direction desired by the measurer and improve the efficiency of margin measurement.

Furthermore, the data signal quality evaluation apparatus according to the invention has the real-time measurement mode in which, whenever the waveform data acquiring unit acquires the minimum number of data items required to display the eye pattern with a predetermined time width, margin measurement is performed on the acquired data. Therefore, it is possible to effectively perform margin measurement and prevent the unnecessary acquisition of data from a low-quality data signal.

DETAILED DESCRIPTION OF THE INVENTION

First Embodiment

Hereinafter, a first embodiment of the invention will be described with reference to the accompanying drawings.

Figure 1:
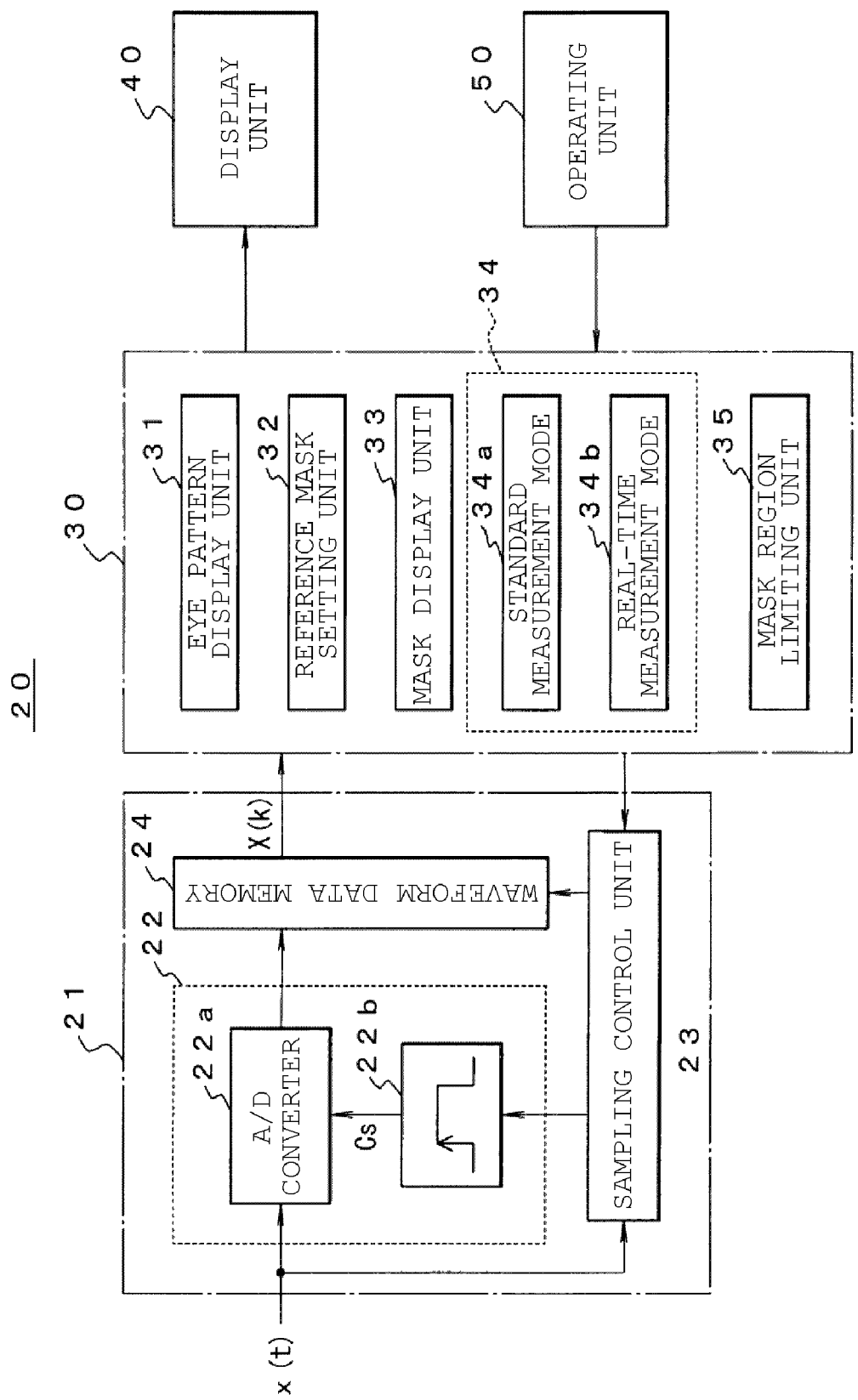
FIG. 1 is a diagram illustrating the structure of an embodiment of the invention.

FIG. 1 is a diagram illustrating the structure of a data signal evaluation apparatus 20 according to the invention.

The data signal quality evaluation apparatus 20 includes a waveform data acquiring unit 21 that receives a data signal x(t) to be measured which is input in an NRZ format and acquires the waveform data of the data signal x(t).

The waveform data acquiring unit 21 uses an equivalent time sampling method in order to acquire the waveform data of a high-speed data signal which is less likely to be acquired by a real-time sampling method. This data acquisition mode includes a first mode that acquires data required to display the waveform of the input data signal x(t) simply in time series and a second mode that is required to display an eye pattern waveform.

The waveform data acquiring unit 21 includes a sampling unit 22, a sampling control unit 23, and a waveform data memory 24.

The sampling unit 22 includes an A/D converter 22a and a sampling clock generator 22b, samples the data signal x(t) input to the A/D converter 22a in synchronization with a sampling clock Cs that is output from the sampling clock generator 22b with a period Ts, and sequentially converts a sample value obtained by the sampling into digital data X(k).

The sampling control unit 23 set the sampling period Ts of the sampling unit 22 according to the mode.

Figure 2:
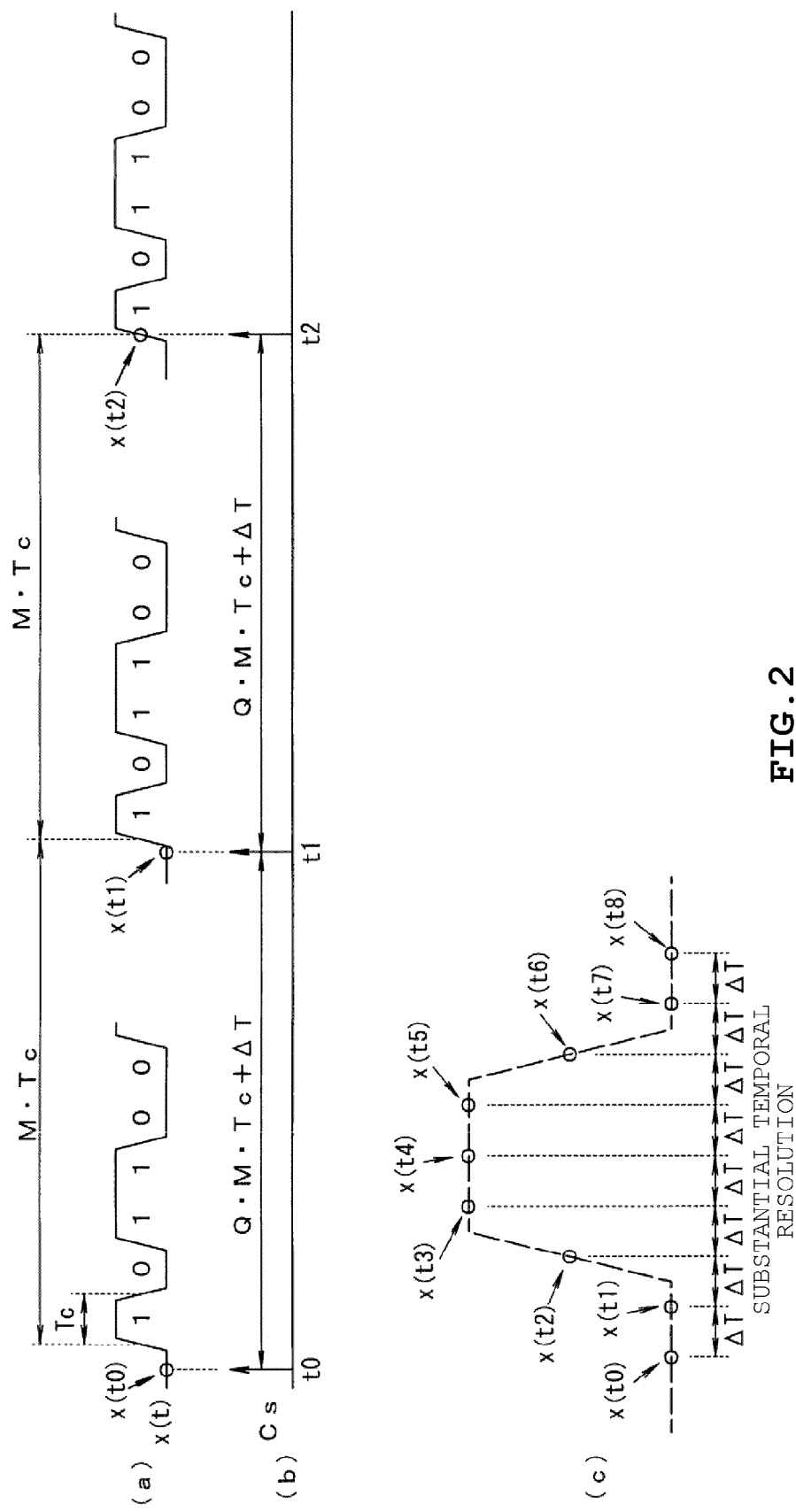
FIG. 2 is a diagram illustrating an example of a waveform acquiring operation according to the embodiment.

That is, when the first mode is designated, for example, for the data signal x(t) shown in (a) of FIG. 2, data X(1), X(2), . . . are acquired with a temporal resolution of $\Delta T$ from a given timing t0 by the equivalent time sampling method and are then stored in the waveform data memory 24 in the order of sampling.

That is, when the data signal x(t) is a signal sequence in which pseudorandom signals with a code length M are repeated with a bit period Tc, the period Ts of a sampling clock is set to a value (for example, $Q \cdot M \cdot Tc + \Delta T$) obtained by adding the temporal resolution $\Delta T$ to the product of a period (M·Tc) and an integer Q (Q includes 1), as shown in (b) of FIG. 2.

When the period Ts is set in this way, a value x(t0) at the timing t0 in the first period of the data signal is sampled and then a value x(t1) at a position t1 that is delayed from the previous timing by $\Delta T$ in a Q-th period of the data signal is sampled. In this way, the position shifted by $\Delta T$ is sampled for every Q period. Therefore, when the waveform is repeated, as shown in (c) of FIG. 2, it is possible to acquire the data of the repeated waveforms of the data signal x(t) with a desired resolution $\Delta T$.

Figure 3:
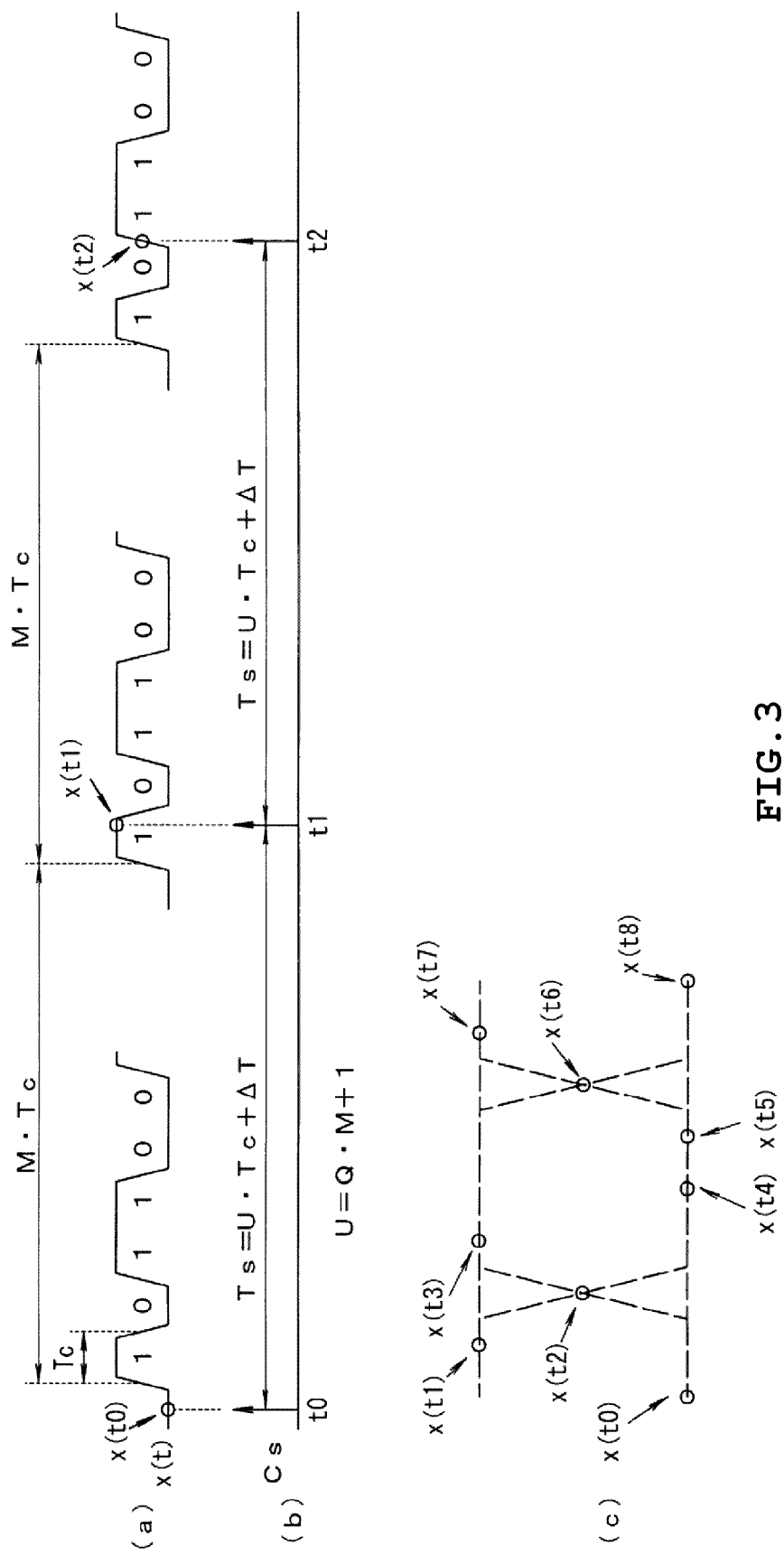
FIG. 3 is a diagram illustrating an example of the waveform acquiring operation according to the embodiment.

When the second mode for displaying the eye pattern is designated, for the data signal x(t) shown in (a) of FIG. 3, the period Ts of the sampling clock is set to a value (for example, $U \cdot Tc + \Delta T$) obtained by adding the temporal resolution $\Delta T$ to the product of the bit period Tc and an integer U (for example, Q·M+1) which is not equal to the value Q·M, as shown in (b) of FIG. 3.

When the period Ts is set in this way, the position shifted by the $\Delta T$ is sampled at every U bits of the data signal x(t) (different bit positions in the period). Therefore, for example, when sampling is performed on 2 bits (2Tc/$\Delta T$ times), which are the minimum bits required to display the eye pattern, it is possible to obtain the data of the eye pattern waveform of the data signal x(t) shown in (c) of FIG. 3. In FIG. 3, for ease of understanding of the operation, the ratio of the temporal resolution $\Delta T$ to the bit period Tc is relatively high and the gap between data for forming the eye pattern is large. However, in practice, the ratio of the temporal resolution $\Delta T$ to the bit period Tc is sufficiently low (for example, 1/100) and the gap between data for forming the eye pattern is sufficiently small. Therefore, a waveform close to the dashed line in (c) of FIG. 3 is obtained.

K data items, which are the minimum data items required to display the eye pattern, are one unit to acquire waveform data.

The sampling control unit 23 extracts a clock component from the data signal x(t) to calculate the bit period Tc, receives parameter information, such as the bit length M of the data signal input from an arithmetic unit 30, which will be described below, and a desired temporal resolution $\Delta T$, determines the period Ts of the sampling clock Cs, and performs sampling with the determined period Ts.

The waveform data of the eye pattern acquired in this way is read by the arithmetic unit 30 and is displayed on the display unit 40. In addition, a data signal evaluation process is performed from the relationship between the waveform data and a region of a reference mask set to the waveform data of the eye pattern.

The arithmetic unit 30 displays information required for various kinds of processes on the display unit 40, receives measurement items or parameters input by, for example, the operation of an operating unit 50, and performs, for example, a waveform display process, a process related to the mask, and an evaluation process.

FIG. 1 shows an eye pattern display unit 31, a reference mask setting unit 32, a mask display unit 33, a quality evaluating unit 34, and a mask region limiting unit 35 as the main units of the arithmetic unit 30.

When the measurement mode relates to the eye pattern, the eye pattern display unit 31 displays the eye pattern of the data signal x(t) on the display unit 40 on the basis of the waveform data acquired by the waveform data acquiring unit 21.

The reference mask setting unit 32 sets a reference mask for quality evaluation related to the eye pattern of the data signal. The reference mask is a polygon (for example, a hexagon, a rectangle, or an octagon in which the upper and lower sides facing each other are parallel) which is substantially similar to the outward shape of a region surrounded by the eye pattern of the data signal and has a size (for example, 0.6 times more than the nominal period Tc) corresponding to the bit rate of the data signal in the horizontal axis (time axis) direction and a size (for example, half of the nominal amplitude of the data signal) corresponding to the amplitude of the data signal in the vertical axis (amplitude axis) direction. It is preferable that the shape data of the reference mask be stored in a memory (not shown) in advance, the bit rate or amplitude of the data signal to be evaluated be input, and a reference mask corresponding to the input information be selected.

The reference mask setting unit 32 may have a function of enabling the user to set and register parameters (for example, at least the height and length of the mask and the edge angles of front and rear parts) for determining the outward appearance of the mask with an arbitrary shape and select parameters from the registered parameters. In this apparatus, the bit period Tc is 1 UI (unit interval).

The mask display unit 33 displays the reference mask set by the reference mask setting unit 32 at a specific position that is suitable to evaluate the quality of the eye pattern.

The display position of the reference mask relative to the eye pattern is normally set such that the center of the reference mask is aligned with the position of the half period (Tc/2) of the middle bit of the eye pattern in the time direction and is aligned with the position of a middle voltage (VH−VL)/2 between the design voltage VL (for example, 0 volt) of data "0" of the data signal and the design voltage VH (for example, 3 volts) of data "1" of the data signal in the amplitude direction. In addition, the reference mask may be fixed at a position where the margins in the phase direction (horizontal direction) and the amplitude direction (vertical direction) are equal to each other on the basis of the waveform data of the actual eye pattern.

The quality evaluating unit 34 performs various kinds of quality evaluation processes on the data signal. Among the quality evaluation processes, when the measurement of compliance using the eye pattern and the mask is designated, the quality evaluating unit 34 counts the number of display points in the region of the reference mask among P display points of the waveform data forming the eye pattern, evaluates the quality of the data signal on the basis of the count value, and displays the evaluation result on the display unit 40.

When the mask region limiting unit 35, which will be described below, limits the effective range of the reference mask, the quality evaluating unit 34 may perform quality evaluation for the limited effective range in operative association with the limitation of the effective range.

When the operating unit 50 is operated to designate an arbitrary width W and an arbitrary angle θ, the mask region limiting unit 35 limits the effective range of the reference mask set to the data signal to the range determined by the designated width and angle and displays the limited effective range on the display unit 40.

Figure 4:
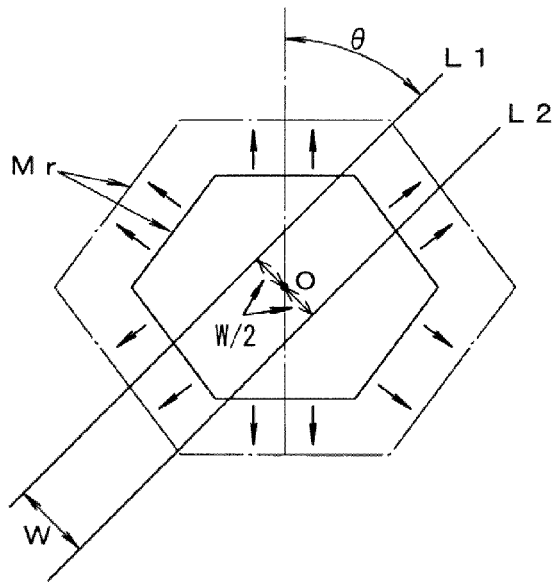
FIG. 4 is a diagram illustrating the relationship between a reference mask and a straight line limiting the effective range of the reference mask.

As shown in FIG. 4, the mask region limiting unit 35 defines two parallel straight lines L1 and L2 which are equidistant (W/2) from the center O of a reference mask Mr, have the center O interposed therebetween, and are inclined at an angle θ, and an overlap region between the region interposed between the two straight lines L1 and L2 and the region of the reference mask Mr is used as the effective range.

Next, an example of display in the measurement state of the data signal quality evaluation apparatus 20 and the operation of the data signal quality evaluation apparatus 20 will be described.

It is assumed that parameters, such as the bit rate, design amplitude information, and code period of the data signal (pseudorandom signal) x(t), are set in advance and the compliance measurement of the reference mask set to the data signal is designated.

Figure 5:
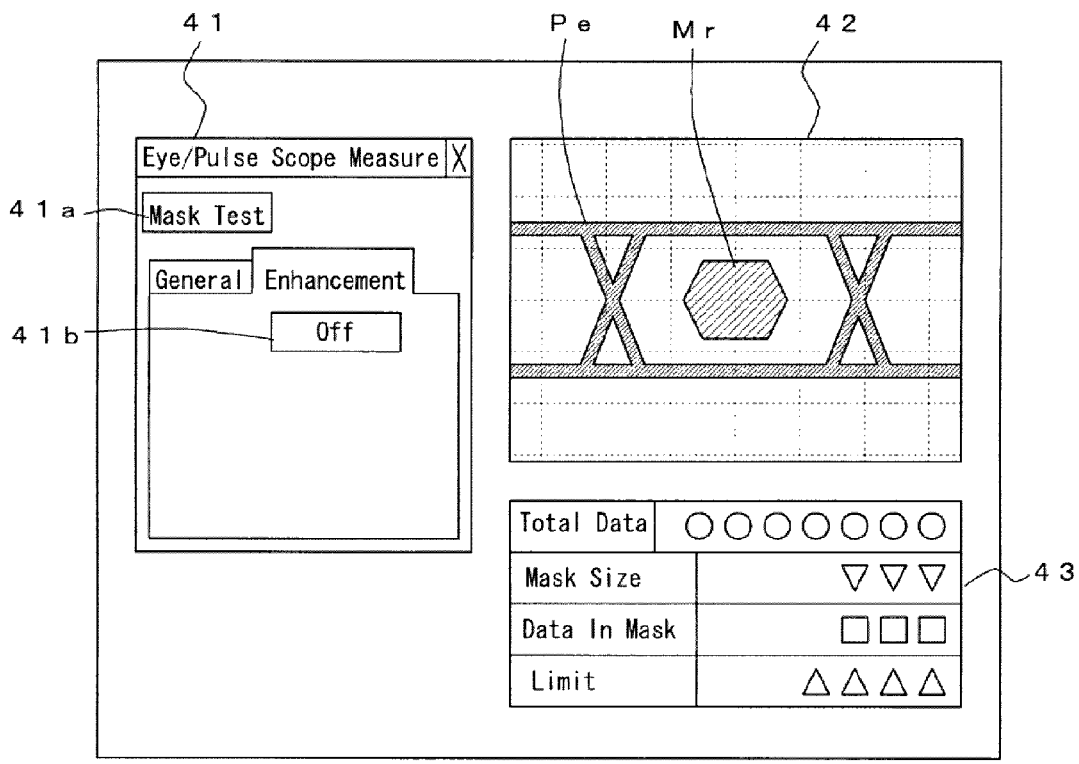
FIG. 5 is a diagram illustrating an example of a display screen during measurement according to the embodiment.

In this state, as shown in FIG. 5, the arithmetic unit 30 displays an eye pattern measurement setting field 41, a waveform mask display field 42, and a measurement result field 43 on the display unit 40.

A button 41a that designates a "mask test" and a button 41b that designates whether to limit the effective region of the mask are displayed in the eye pattern measurement setting field 41. When the button 41b is turned "off", as shown in the waveform mask display field 42 of FIG. 5, the set hexagonal reference mask Mr is displayed at the predetermined position (the center position of the amplitude at the center of the middle bit of an eye pattern Pe in the time direction), and measurement is performed on the entire hexagonal region as the effective region to calculate, for example, the total number (Total Data) of points of the waveform data of the eye pattern Pe acquired from the data signal, the number of data items (Data In Mask) in the mask region, and a limit (Limit). Then, the measurement result is displayed in the measurement result field 43.

Figure 6:
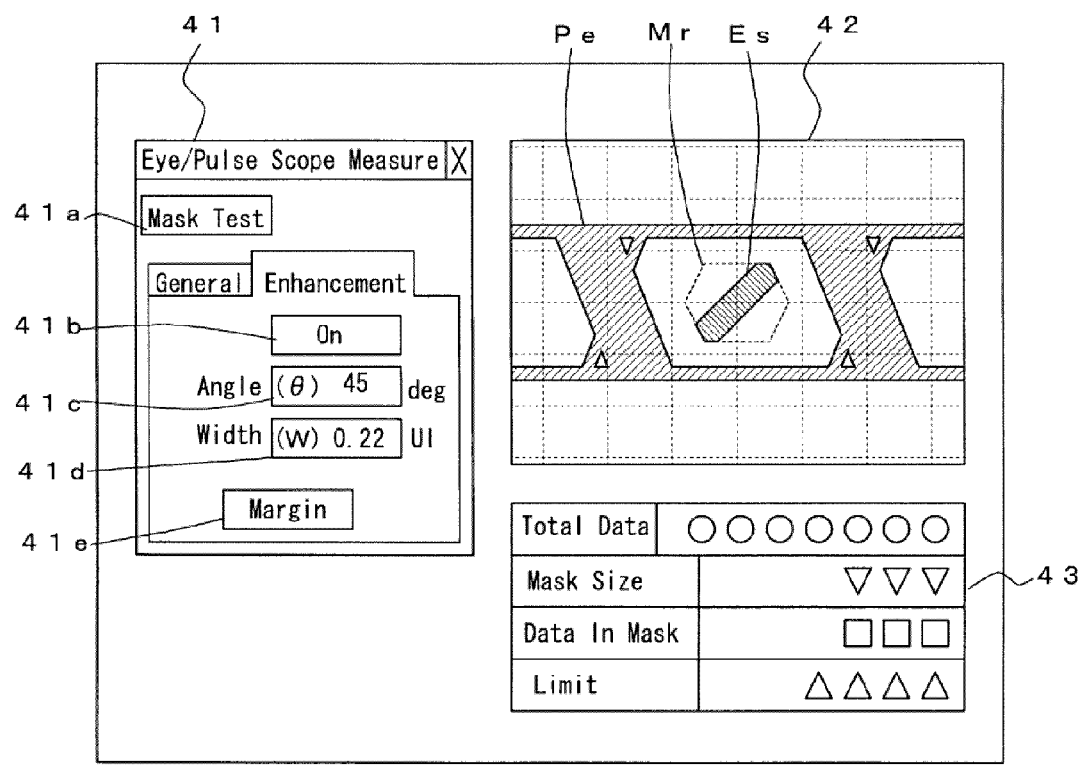
FIG. 6 is a diagram illustrating an example of the display screen during measurement according to the embodiment.

When the button 41b is changed from an "off" state to an "on" state by, for example, the operation of a mouse of the operating unit 50, as shown in FIG. 6, windows 41c and 41d used to designate the angle and width for limiting the effective region of the reference mask appear.

When a desired angle θ (in this embodiment, for example, θ is 45 degrees) and a desired width W (in this embodiment, for example, W is 0.22 UI) are input to the windows 41c and 41d, the region of the reference mask Mr is limited to a range with a width W of 0.02 UI and an angle θ of 45 degrees (clockwise rotation about the amplitude direction), as shown in FIG. 6.

With the limitation of the region, the number of data items in the limited region Es in the total number of waveform data items of the eye pattern Pe acquired from the data signal is calculated, and the calculation result is displayed in the measurement result field 43.

Figure 7:
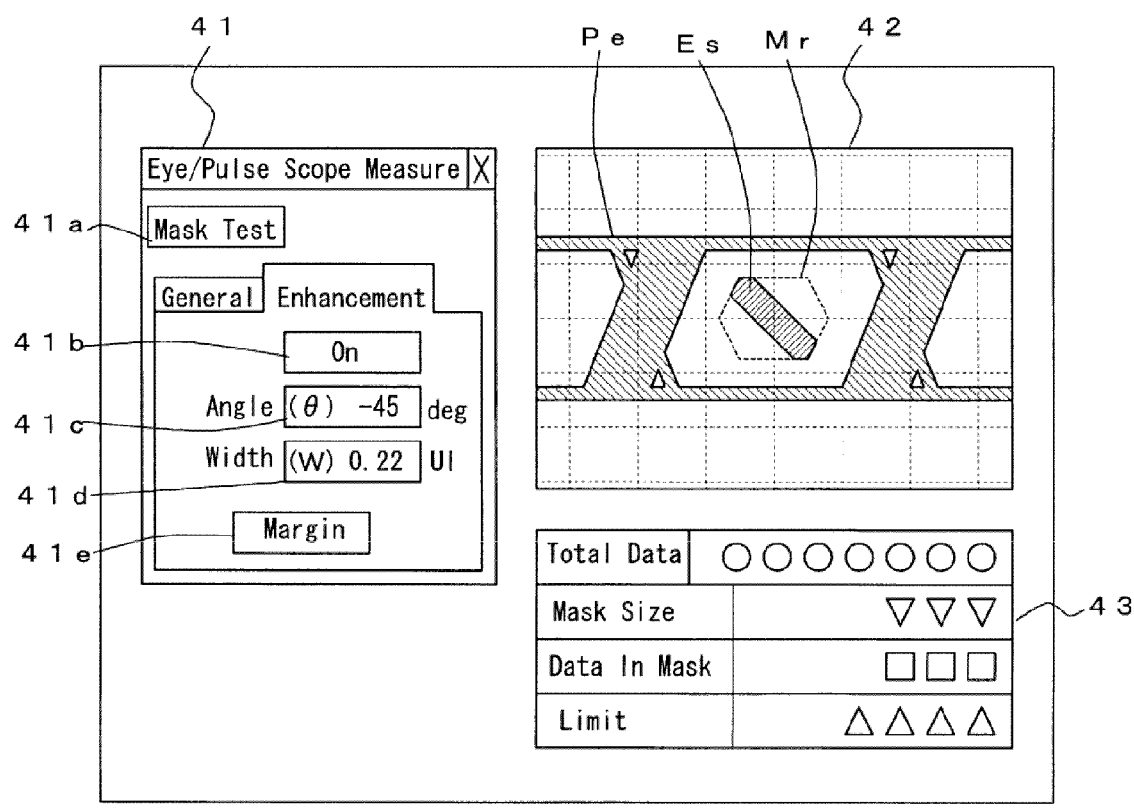
FIG. 7 is a diagram illustrating an example of the display screen during measurement according to the embodiment.

In the example of the display, compliance measurement is focused on a falling portion which is represented by a bold line (large jitter occurs) in the eye pattern Pe. However, when the jitter of the rising portion is measured, for example, an angle θ of −45 degrees is input, as shown in FIG. 7. In this way, the effective range of the reference mask Mr is limited to the region Es that has the width W and is inclined 45 degrees in the counterclockwise direction, as shown in the waveform mask display field 42 of FIG. 7, and compliance measurement can be focused on the jitter of the rising portion of the data signal.

Figure 8:
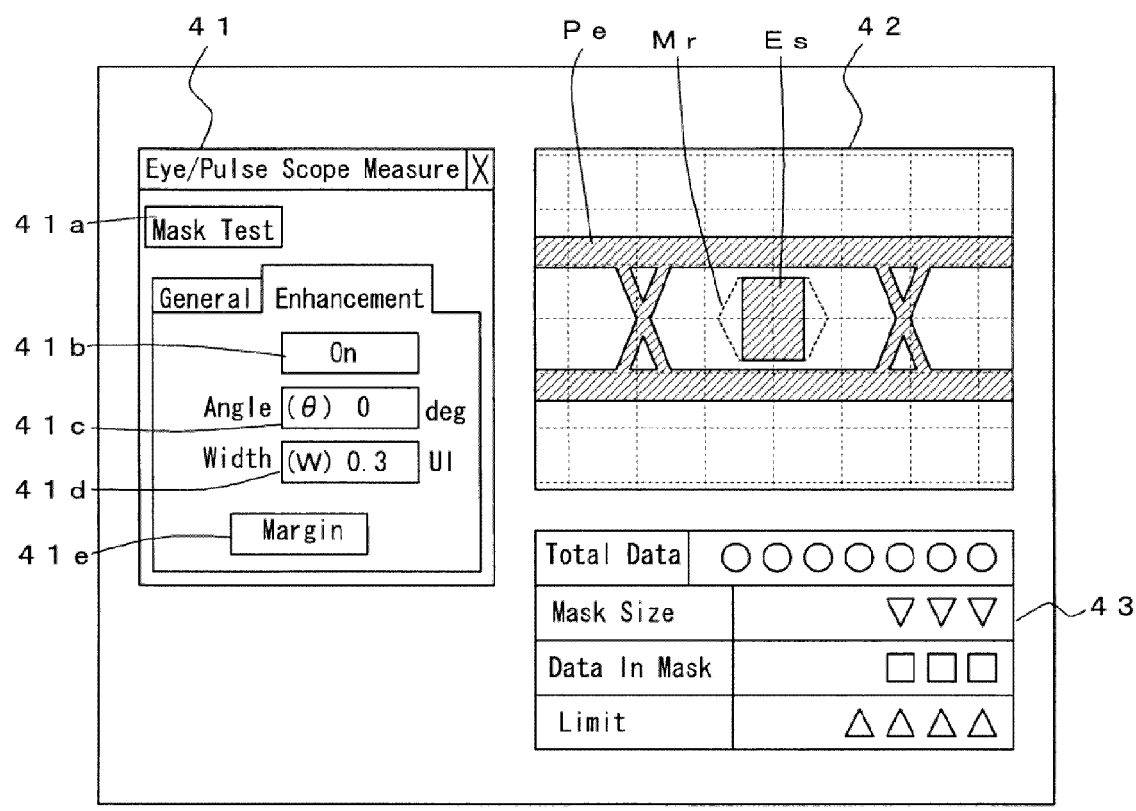
FIG. 8 is a diagram illustrating an example of the display screen during measurement according to the embodiment.
Figure 9:
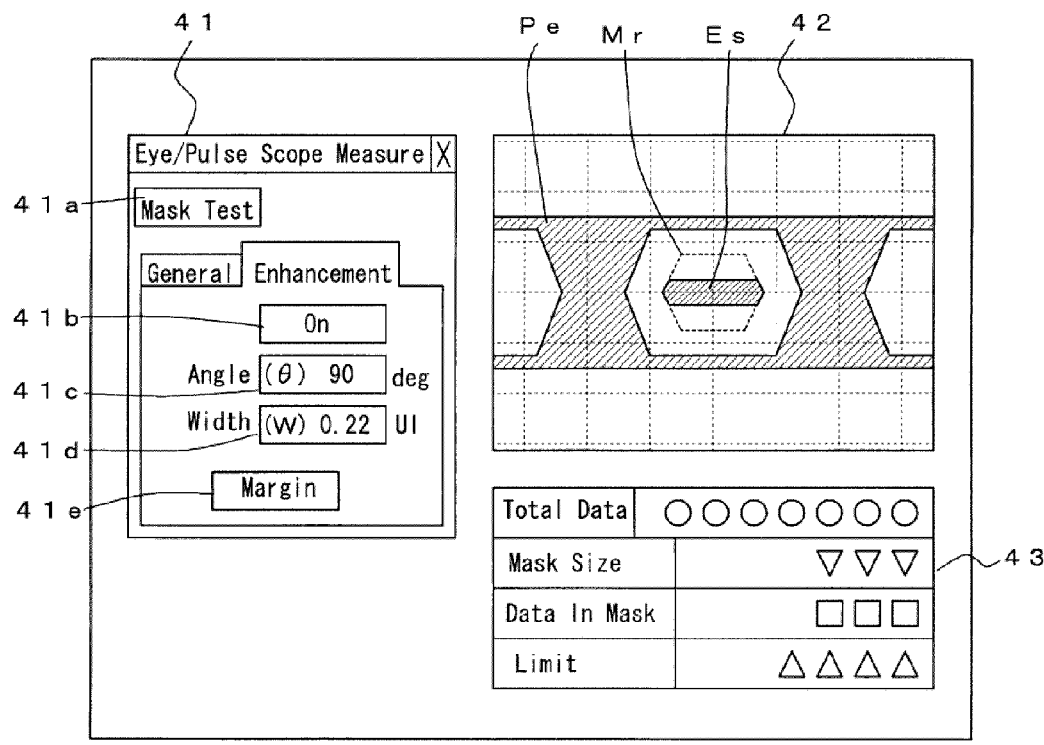
FIG. 9 is a diagram illustrating an example of the display screen during measurement according to the embodiment.

As shown in FIG. 8, when θ is 0, the effective range of the reference mask Mr has the width W and is limited in the amplitude axis direction as shown in the waveform mask display field 42, and compliance measurement can be focused on a fluctuation in the amplitude of the data signal. As shown in FIG. 9, when θ is 90 (or −90), the effective range of the reference mask Mr has the width W and is limited in the time axis direction as shown in the waveform mask display field 42, and compliance measurement can be focused on jitter which includes the rising and falling portions of the data signal.

Figure 14:
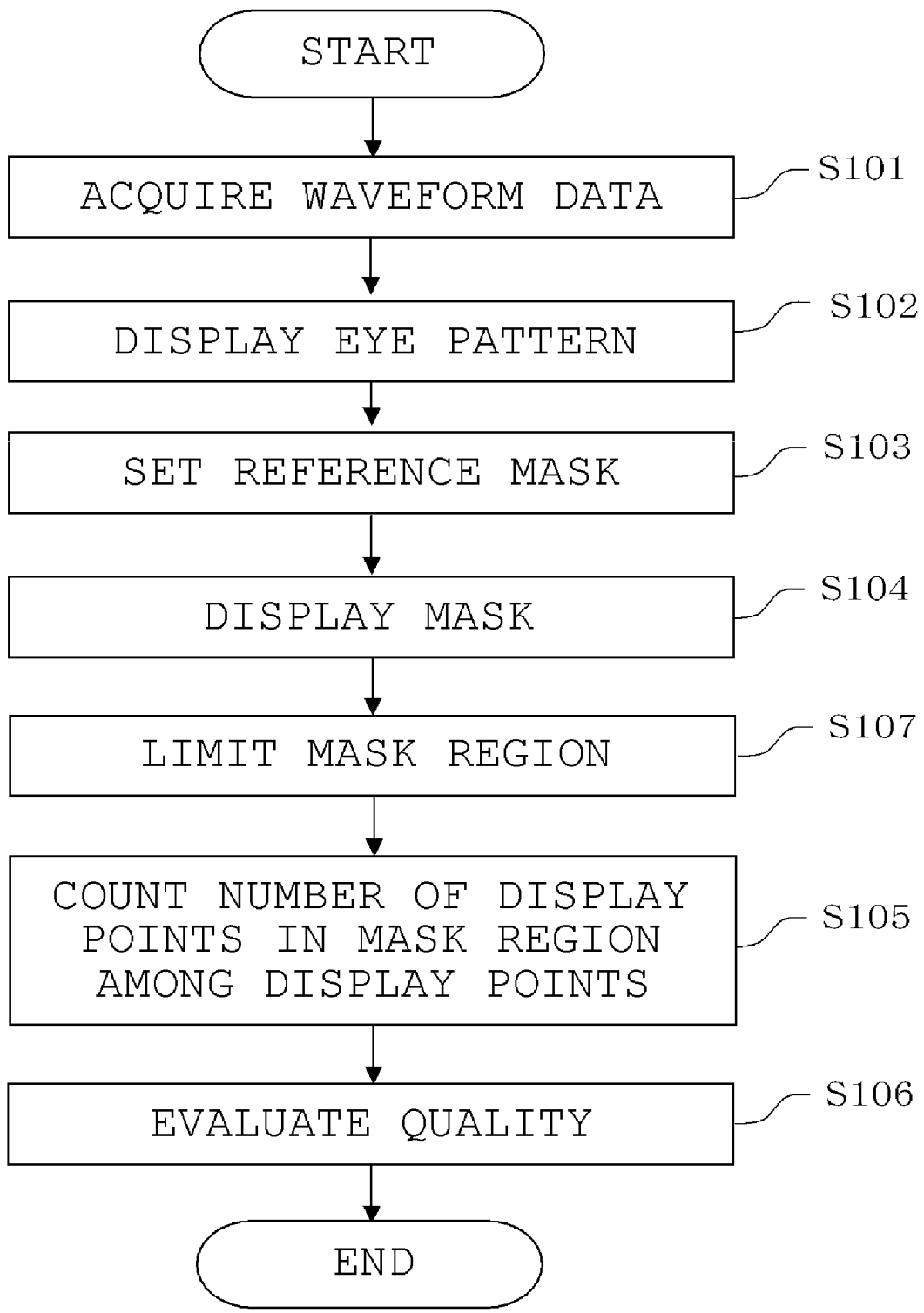
FIG. 14 is a flowchart illustrating the procedure of a main process according to the embodiment.

Next, a software operation according to the invention will be described with reference to the flowchart shown in FIG. 14.

Sampling is performed on a data signal to be evaluated which has a desired bit rate and a desired amplitude to acquire the waveform data of the data signal (S101).

Then, the eye pattern of the data signal is displayed on the basis of the waveform data obtained in the waveform data acquiring step (S102).

Then, a mask which has a polygonal shape substantially similar to the shape of a region surrounded by the eye pattern of the data signal and has a size corresponding to the bit rate and amplitude of the data signal is set as the reference mask for evaluating the quantity of the data signal (S103).

Then, the set reference mask is displayed at a desired position which overlaps the region surrounded by the eye pattern of the data signal (S104).

Then, an arbitrary width and angle is designated to the effective range of the reference mask and the effective range of the reference mask is limited to the range determined by the designated width and angle. In addition, the limited effective range is displayed on the display unit (S107).

Among the display points of the waveform data forming the eye pattern, the number of display points in the region of the reference mask is counted (S105).

Next, the quality of the data signal is evaluated on the basis of the count value and the evaluation result of the quality is displayed (S106).

When the effective range of the mask in the compliance measurement is limited as described above, the waveform data in the limited range may be found during evaluation. Therefore, it is possible to obtain a required result in a short time, as compared to a case in which the entire region of the reference mask is measured, and thus improve the efficiency of measurement. Since only two parameters, that is, the width and the angle are input, an input operation is very easy, which results in improvement in the efficiency of measurement.

Second Embodiment

Next, a second embodiment of the invention will be described with reference to the drawings.

A description of the same components as those in the first embodiment will be omitted.

Up to the operation of a mask display unit 33 displaying the reference mask set by a reference mask setting unit 32 at a specific position suitable to evaluate the quality of the eye pattern is the same as in the first embodiment.

A quality evaluating unit 34 according to the second embodiment performs various kinds of quality evaluation processes on a data signal. Among the quality evaluation processes, when the measurement of a margin using the eye pattern and the mask is designated, the quality evaluating unit 34 sequentially enlarges the size of the set reference mask, counts the number of display points in the regions of the reference masks with different sizes among P display points of the waveform data forming the eye pattern. Then, the quality evaluating unit 34 performs quality evaluation on the margin of the data signal for the reference mask from the relationship between the count value and the mask enlargement ratio and displays the evaluation result on the display unit 40.

When a mask region limiting unit 35, which will be described below, limits the effective range of the reference mask (including the enlarged reference mask), the quality evaluating unit 34 performs quality evaluation for the limited effective range in operative association with the limitation of the effective range.

When an operating unit 50 is operated to designate an arbitrary width W and an arbitrary angle θ, the mask region limiting unit 35 limits the effective range of the reference mask set to the data signal and the enlarged reference mask to the range determined by the designated width and angle and displays the limited effective range on the display unit 40.

As shown in FIG. 4, the mask region limiting unit 35 defines two parallel straight lines L1 and L2 which are equidistant (W/2) from the center O of a reference mask Mr (including an enlarged mask), have the center O interposed therebetween, and are inclined at the angle θ, and an overlap region between the region interposed between the two straight lines L1 and L2 and the region of the reference mask Mr is used as the effective range.

Next, an example of display in the measurement state of the data signal quality evaluation apparatus 20 and the operation of the data signal quality evaluation apparatus 20 will be described.

It is assumed that parameters, such as the bit rate, design amplitude information, and code period of the data signal (pseudorandom signal) x(t), are set in advance and the margin measurement of the reference mask set to the data signal is designated.

In this state, as shown in FIG. 5, the arithmetic unit 30 displays an eye pattern measurement setting field 41, a waveform mask display field 42, and a measurement result field 43 on the display unit 40.

A button 41a that designates a "mask test" and a button 41b that designates whether to limit the mask effective region are displayed in the eye pattern measurement setting field 41. When the button 41b is turned "off", as shown in the waveform mask display field 42 of FIG. 5, the set hexagonal reference mask Mr is displayed with a standard size at the predetermined position (the center position of the amplitude at the center of the middle bit of an eye pattern Pe in the time direction), and measurement is performed using the entire hexagonal region as the effective region to calculate, for example, the total number (Total Data) of points of the waveform data of the eye pattern Pe acquired from the data signal, the enlargement ratio (Mask Size) of the mask, the number of data items (Data In Mask) in the mask region, and a limit (Limit). Then, the calculation result is displayed in the measurement result field 43.

When the button 41b is changed from an "off" state to an "on" state by, for example, the operation of a mouse of the operating unit 50, as shown in FIG. 6, windows 41c and 41d used to designate the angle and width for limiting the effective region of the reference mask and a button 41e for measuring the margin appear.

When the button 41e is turned on without inputting a numerical value to the windows 41c and 41d, the size of the reference mask is enlarged in a predetermined step (for example, in a step of 1 percent), the number of display points in the entire region of the enlarged mask is counted, and the count result is displayed. When the number of display points is more than a limit value, the previous mask enlargement ratio remains as the measurement result of the margin and the margin measurement ends.

When a desired angle θ (in this embodiment, for example, θ is 45 degrees) and a desired width W (in this embodiment, for example, W is 0.22 UI) are input to the windows 41c and 41d, the region of the reference mask Mr is limited to a range with a width W of 0.02 UI and an angle θ of 45 degrees (clockwise rotation about the amplitude direction), as shown in FIG. 6.

With the limitation of the region, the number of data items in the limited region Es in the total number of waveform data items of the eye pattern Pe acquired from the data signal is calculated, and the calculation result is displayed in the measurement result field 43.

Figure 10:
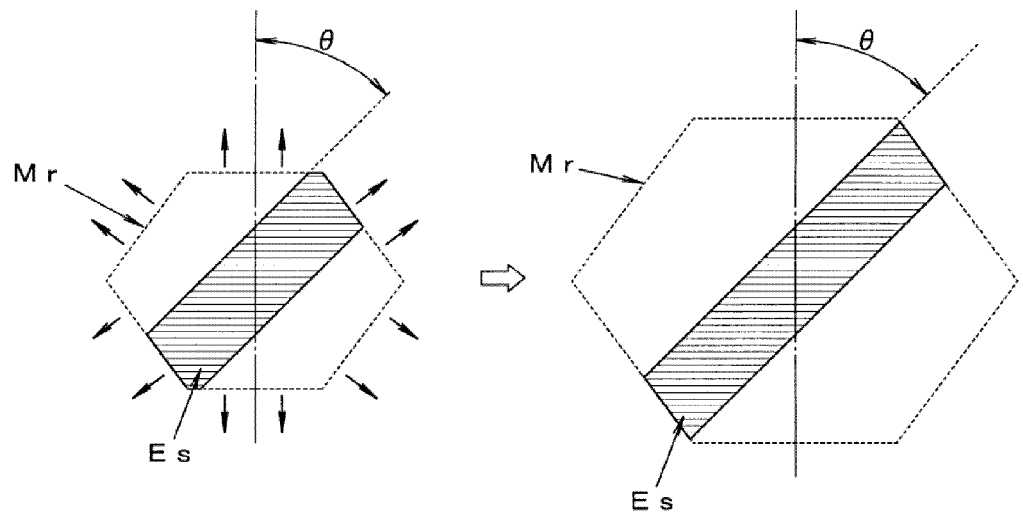
FIG. 10 is a diagram illustrating an example of a variation in a limited region with the enlargement of a mask.
Figure 11:
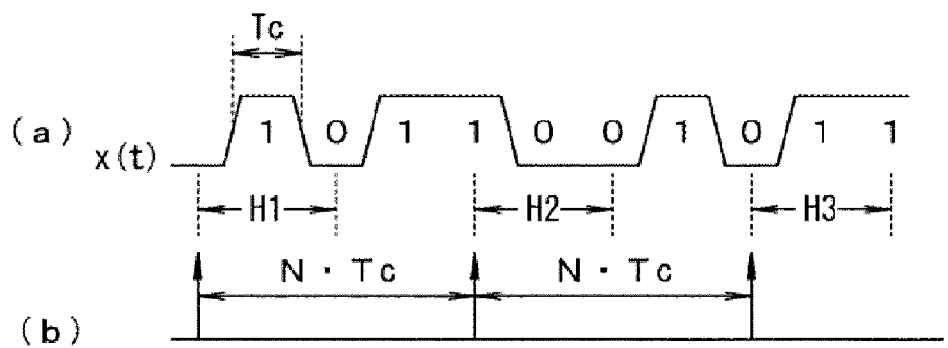
FIG. 11 is a diagram illustrating a process of generating an eye pattern waveform from a data signal.
Figure 11:
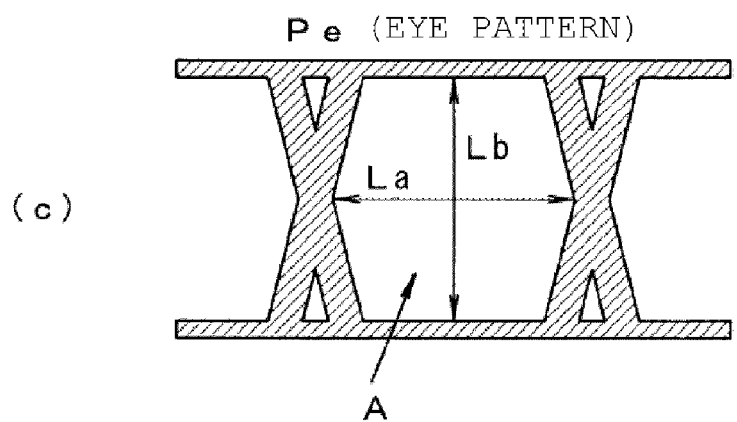
Figure 12:
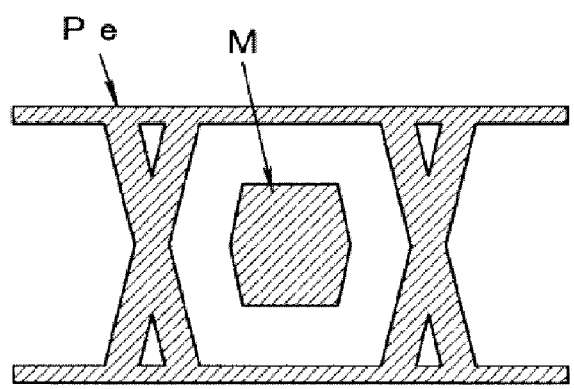
FIG. 12 is a diagram illustrating an example of a measurement screen in which a mask overlaps an eye pattern.

In this state, when the button 41e is turned on, the limited region Es extends in a specific direction (θ direction) with the enlargement of the reference mask (the width W and the angle θ of the region Es are maintained), as shown in FIG. 10. The number of display points in the region Ee with each size is calculated. When the number of display points is more than a limit value, the previous mask enlargement ratio remains as the measurement result of the margin and the margin measurement ends. The button 41e is operated to start a new margin measurement process.

In the example of the display shown in FIG. 6, margin measurement is focused on a falling portion which is represented by a bold line (large jitter occurs) in the eye pattern Pe. However, when margin measurement is performed on the jitter of the rising portion, for example, an angle θ of −45 degrees is input and the button 41e is turned on, as shown in FIG. 7. In this way, the effective range of the reference mask Mr including the enlarged reference mask is limited to the range Es that has the width W and is inclined 45 degrees in the counterclockwise direction, as shown in the waveform mask display field 42 of FIG. 7, and margin measurement can be focused on the jitter of the rising portion of the data signal.

As shown in FIG. 8, when the button 41e is operated at θ=0, the effective range of the reference mask Mr has the width W and is limited in the amplitude axis direction as shown in the waveform mask display field 42, and margin measurement can be focused on a fluctuation in the amplitude of the data signal. As shown in FIG. 9, when the button 41e is operated at θ=90 (or −90), the effective range of the reference mask Mr has the width W and is limited in the time axis direction as shown in the waveform mask display field 42, and margin measurement can be focused on jitter which includes the rising and falling portions of the data signal.

Figure 15:
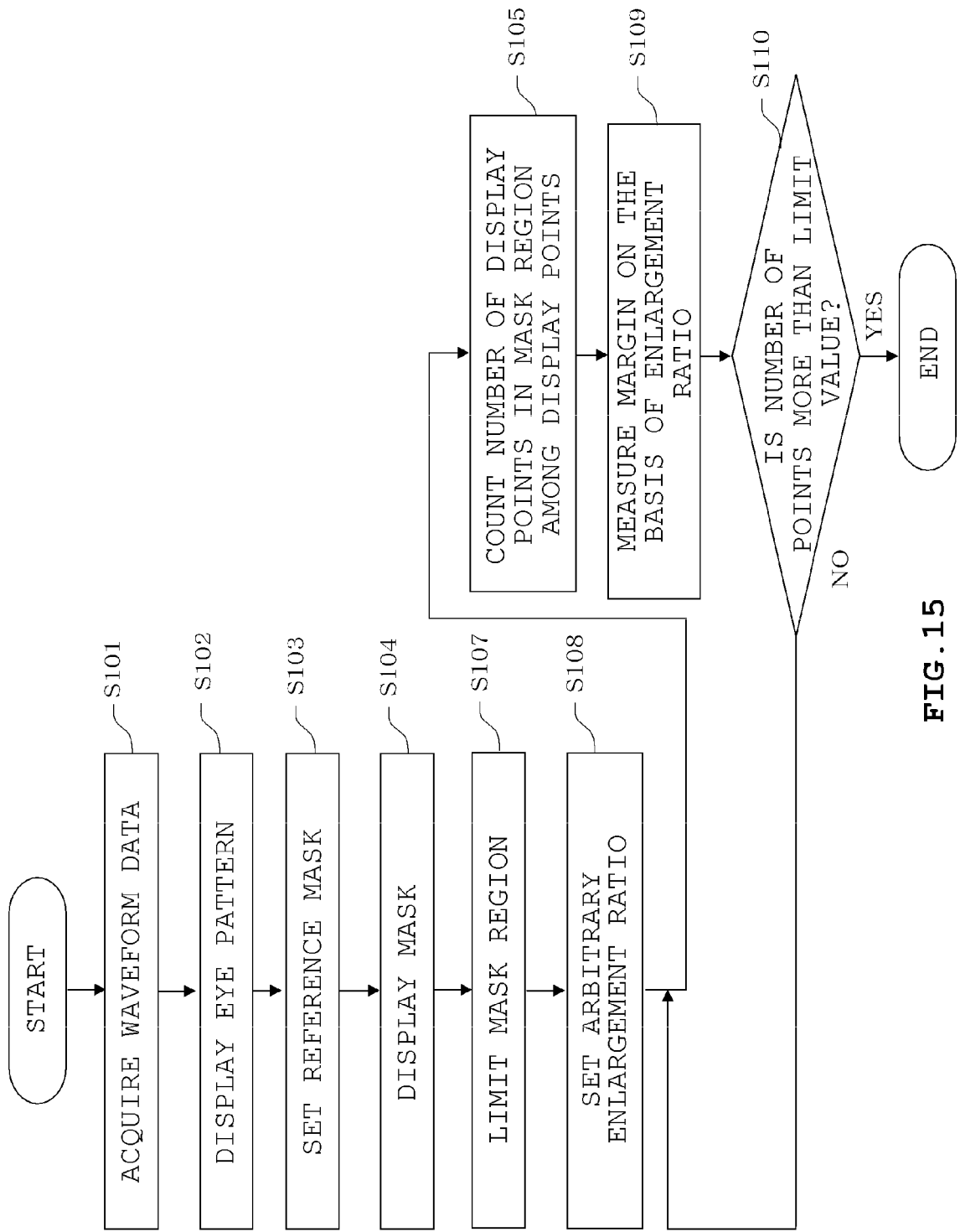
FIG. 15 is a flowchart illustrating the procedure of a main process according to the embodiment.

Next, a software operation according to the invention will be described with reference to a flowchart shown in FIG. 15.

Sampling is performed on a data signal to be evaluated which has a desired bit rate and a desired amplitude to acquire the waveform data of the data signal (S101).

Then, the eye pattern of the data signal is displayed on the basis of the waveform data obtained in the waveform data acquiring step (S102).

Then, a mask which has a polygonal shape substantially similar to the shape of a region surrounded by the eye pattern of the data signal and has a size corresponding to the bit rate and amplitude of the data signal is set as the reference mask for evaluating the quantity of the data signal (S103).

Then, the set reference mask is displayed at a desired position where it overlaps the region surrounded by the eye pattern of the data signal (S104).

Then, an arbitrary width and angle is designated to the effective range of the reference mask and the effective range of the reference mask is limited to the range determined by the designated width and angle. In addition, the limited effective range is displayed on the display unit (S107).

Then, a mask that is enlarged from the reference mask at an arbitrary enlargement ratio is set instead of the reference mask (S108).

Then, the number of display points in the effective range based on the enlarged mask is counted (S105).

Then, the margin of the data signal for the reference mask is measured on the basis of the number of display points in the enlarged mask and the number of display points in the reference mask and the measurement result of the margin is displayed (S109).

When the number of display points is more than a limit value, the previous mask enlargement ratio remains as the measurement result of the margin and the margin measurement ends (S110).

When the effective range of the mask in margin measurement is limited as described above, the waveform data in the limited range may be found during evaluation. Therefore, it is possible to obtain a required result in a short time, as compared to a case in which the entire enlarged region of the reference mask is measured, and thus improve the measurement efficiency of the margin. Since only two parameters, that is, the width and the angle are input, an input operation is very easy, which results in improvement in the efficiency of measurement.

Third Embodiment

Next, a third embodiment of the invention will be described with reference to the drawings.

A description of the same components as those in the first and second embodiments will be omitted.

Up to the operation of a mask display unit 33 displaying the reference mask set by a reference mask setting unit 32 at a specific position suitable to evaluate the quality of the eye pattern is the same as that in the first and second embodiments.

In the third embodiment, the display position of the reference mask relative to the eye pattern is normally set such that the center of the reference mask is aligned with the position of the half period (Tc/2) of the middle bit of the eye pattern in the time direction and is aligned with the position of a middle voltage (VH−VL)/2 between the design voltage VL (for example, 0 volt) of data "0" of a data signal and the design voltage VH (for example, 3 volts) of data "1" of the data signal in the amplitude direction. In addition, the reference mask may be fixed at the optimal position where margins in the phase direction (horizontal direction) and the amplitude direction (vertical direction) are equal to each other on the basis of the waveform data of the actual eye pattern, as a preparation stage for measurement.

A quality evaluating unit 34 according to the third embodiment performs various kinds of quality evaluation processes on a data signal. When the measurement of a margin using the eye pattern and the mask is designated by the operation of the operating unit, the quality evaluating unit 34 sequentially enlarges the size of the set reference mask, counts the number of display points in the regions of the reference masks with different sizes among P display points of the waveform data forming the eye pattern. Then, the quality evaluating unit 34 performs quality evaluation on the margin of the data signal for the reference mask from the relationship between the count value and the mask enlargement ratio and displays the evaluation result on the display unit 40.

There are two margin measurement modes. One of the two margin measurement modes is a standard measurement mode 34a in which a predetermined number of waveform data items (for example, 100000 waveform data items) are acquired as the total number P of waveform data items used to display the eye pattern, the reference mask is enlarged for the eye pattern represented by the data, and the maximum size at which the number of data items in the reference mask is not more than a limit is calculated as a mask margin.

Figure 16:
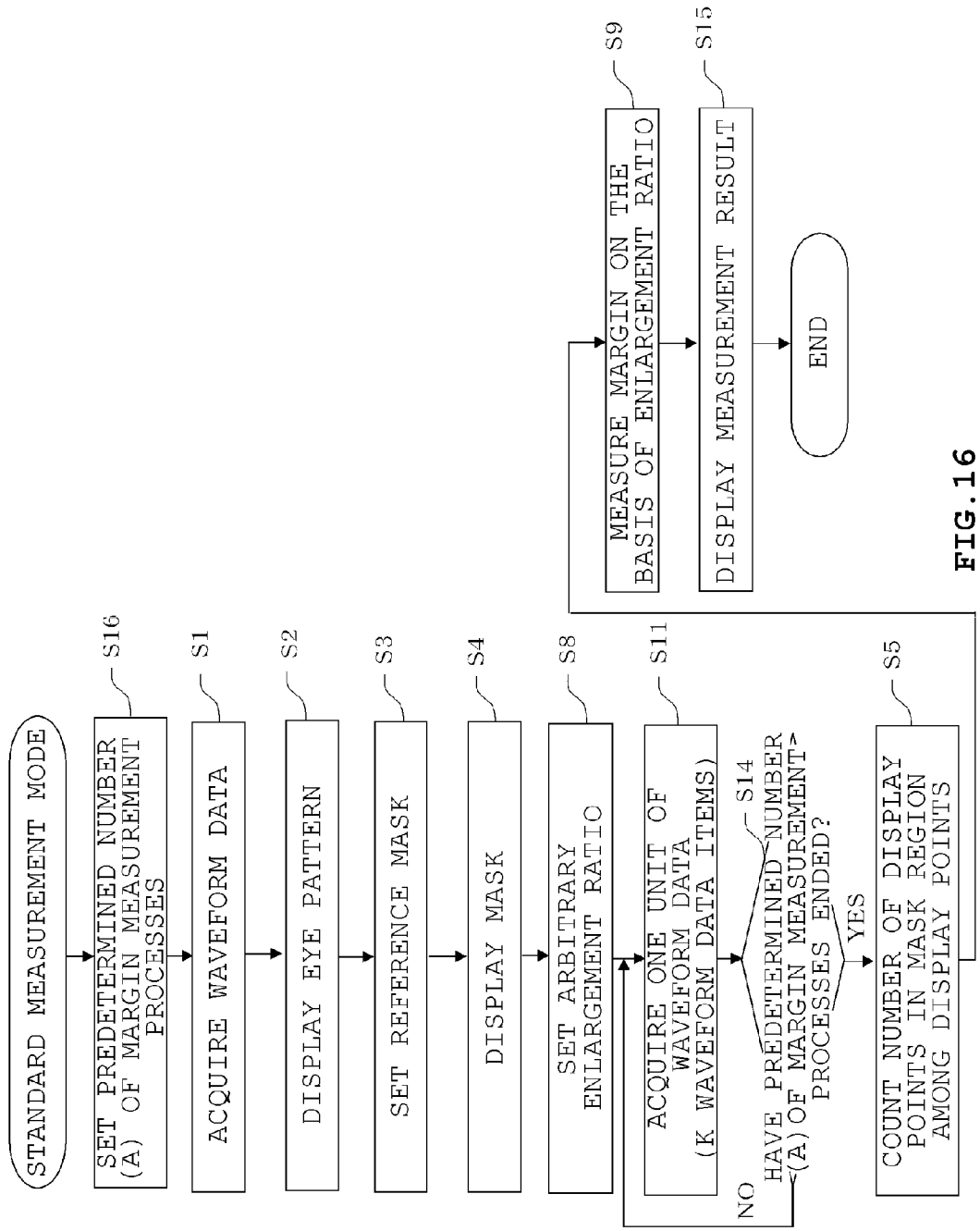
FIG. 16 is a flowchart illustrating the procedure of a main process according to the embodiment.

As shown in the flowchart of FIG. 16, in the standard measurement mode 34a, sampling is performed on a data signal to be evaluated which has a desired bit rate and a desired amplitude to acquire the waveform data of the data signal (S1).

Then, the eye pattern of the data signal is displayed on the basis of the waveform data obtained in the waveform data acquiring step (S2).

Then, a mask which has a polygonal shape substantially similar to the shape of a region surrounded by the eye pattern of the data signal and has a size corresponding to the bit rate and amplitude of the data signal is set as the reference mask for evaluating the quantity of the data signal (S3).

Then, the reference mask set in the reference mask setting step is displayed at a desired position which overlaps the region surrounded by the eye pattern of the data signal (S4).

Then, an arbitrary enlargement ratio is set (S8). Then, the waveform data acquiring unit 21 repeatedly performs a process of acquiring K waveform data items once A times (for example, A is 1000). That is, the waveform data acquiring unit 21 acquires P (=K·A) data items (S11, S14, and S16).

Then, the number of display points in the region of the reference mask among the display points of the waveform data forming the eye pattern is counted (S5).

Figure 13:
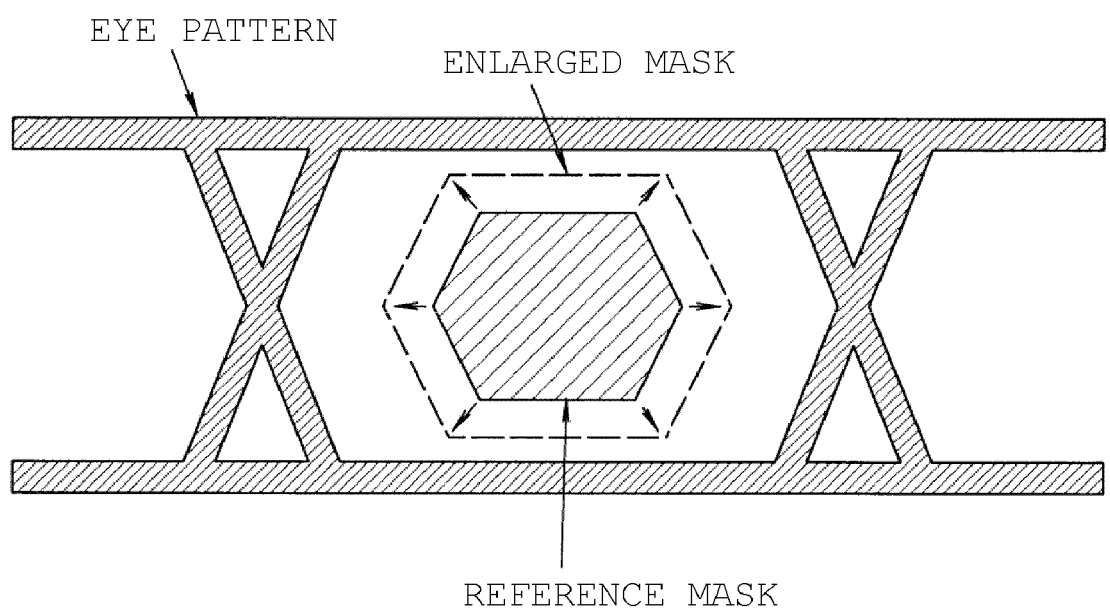
FIG. 13 is a diagram illustrating the measurement of a margin according to the embodiment.

Then, margin measurement is performed on the data (S9), and the measurement result is displayed (S15). That is, as shown in FIG. 13, the set reference mask is enlarged and the number of data items in the reference mask among the data items forming the eye pattern is calculated and the maximum size at which the number of data items is not more than a limit is calculated as a mask margin. Then, the result is displayed.

The other mode is a real-time measurement mode 34b in which, whenever the waveform data acquiring unit 21 acquires the minimum number of data items required to display the eye pattern with a predetermined time width (2 UI), margin measurement is performed on the acquired data.

Figure 17:
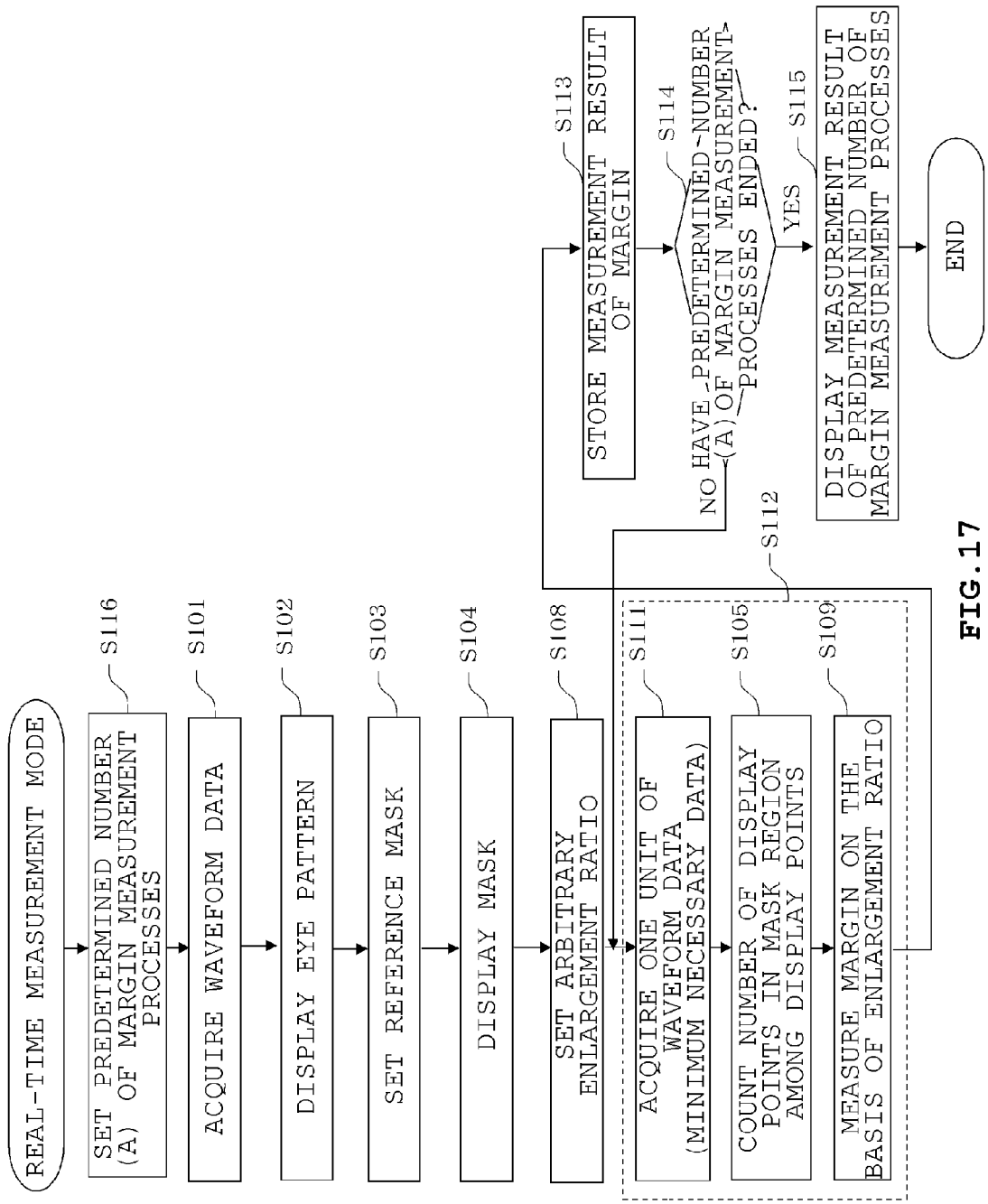
FIG. 17 is a flowchart illustrating the procedure of a main process according to the embodiment.

In the real-time measurement mode 34b, as shown in the flowchart of FIG. 17, sampling is performed on a data signal to be evaluated which has a desired bit rate and a desired amplitude to acquire the waveform data of the data signal (S101).

Then, the eye pattern of the data signal is displayed on the basis of the waveform data obtained in the waveform data acquiring step (S102).

Then, a mask which has a polygonal shape substantially similar to the shape of a region surrounded by the eye pattern of the data signal and has a size corresponding to the bit rate and amplitude of the data signal is set as the reference mask for evaluating the quantity of the data signal (S103).

Then, the reference mask set in the reference mask setting step is displayed at a desired position which overlaps the region surrounded by the eye pattern of the data signal (S104).

Then, an arbitrary enlargement ratio is set (S108).

Then, margin measurement is performed whenever K waveform data items are acquired once, and the result is displayed (S111, S105, and S109).

In FIG. 17, Steps S111, S105, and S109 are represented by a dotted line as the real-time measurement mode S112.

In the margin measurement, as shown in FIG. 13, for K data items that are significantly smaller than a predetermined number K·A, the set reference mask is enlarged, the number of data items in each mask is calculated, the maximum size at which the number of data items in the mask is not more than a predetermined limit is calculated as a mask margin, and the result is displayed. In this mode, a value that is (for example, 1/A times) less than a limit for a predetermined number (K·A) of data items is set as the limit.

It is preferable that the relationship between the enlargement ratio of the mask and the number of data items in the mask be known from the measurement result of the margin in the real-time measurement mode. A method of displaying a data histogram for each mask size as well as a method of displaying the limit and the maximum enlargement ratio satisfying the limit may be used as a method of displaying the measurement result of the margin. In addition, the determination of success or failure based on the limit may not be performed.

As such, when margin measurement is performed each time one unit of waveform data is acquired, it is possible to effectively obtain the margin of the data signal for the reference mask.

As a preliminary measurement process before the standard measurement mode is performed, Steps S111, S105, and S109 are simply repeated an arbitrary number of times (see S116 in FIG. 17). In this case, it is possible to easily grasp the outline of the quality of the data signal. In addition, the position of the reference mask may be changed by the operation of the operating unit 50, the real-time measurement mode may be used to find the position where the margin is the maximum, and the position may be determined to be the reference position of the reference mask.

As shown in FIG. 17, when the waveform data obtained in each waveform data acquiring process and the number of data items for each mask size are added while Steps S111, S105, and S109 are repeatedly performed, it is possible to obtain the measurement result of the margin for a predetermined number of data items (for example, 100000 data items) at the time when an A-th measurement process ends (S111, S105, and S109). In this case, it is possible to obtain the measurement result of the margin in each step until a predetermined number of data items are acquired and the measurement result for a predetermined number of data items. In addition, whenever the number of data items for each mask size is added, determination based on the limit value set to a predetermined number of data items is performed. When the quality of the data signal is low and the determination result is more than the limit value at a small enlargement ratio, the measurement process ends at that time. Therefore, it is possible to prevent unnecessary measurement.

When Steps S111, S105, and S109 are simply repeated, the eye pattern is displayed by newly writing the eye pattern formed by the acquired K data items. However, when Steps S113 to S115 are performed and a method of storing and overwriting A units of eye patterns formed by the acquired K data items is used, any method of displaying the measurement result may be used.

As such, the data signal quality evaluation apparatus 20 according to the embodiment has the real-time measurement mode in which, whenever the waveform data acquiring unit 21 acquires K data items, which are the minimum number of data items required to display the eye pattern with a predetermined time width (in this embodiment, 2 UI), margin measurement is performed on the acquired data. Therefore, it is possible to effectively perform margin measurement and prevent the unnecessary acquisition of data from a low-quality data signal.

What is claimed is:

1. A data signal quality evaluation apparatus comprising:
a waveform data acquiring unit (21) that performs sampling on a data signal to be evaluated which has a desired bit rate and a desired amplitude to acquire waveform data of the data signal;
a display unit (40);
an operating unit (50);
an eye pattern display unit (31) that displays an eye pattern of the data signal on the display unit on the basis of the waveform data acquired by the waveform data acquiring unit;
a mask setting unit (32) that sets a mask which has a polygonal shape substantially similar to a shape of a region surrounded by the eye pattern of the data signal and has a size corresponding to the bit rate and amplitude of the data signal as a reference mask for evaluating quality of the data signal;
a mask display unit (33) that displays the reference mask set by the mask setting unit at a desired position which overlaps the region surrounded by the eye pattern of the data signal;
a quality evaluating unit (34) that determines a count value by counting a number of display points in the region of the reference mask among the display points of the waveform data forming the eye pattern, evaluates the quality of the data signal on the basis of the count value, and displays an evaluation result of the quality on the display unit; and
a mask region limiting unit (35) that limits an effective range of the reference mask to a range determined by an arbitrary width and angle designated by an operation of the operating unit and displays the limited effective range on the display unit,
wherein the quality evaluating unit performs quality evaluation on the limited effective range.

2. The data signal quality evaluation apparatus according to claim 1,
wherein the mask region limiting unit uses an overlap range between a region interposed between two parallel straight lines which are equidistant from the center of the reference mask and are inclined at a predetermined angle and the region of the reference mask as the effective range.

3. The data signal quality evaluation apparatus according to claim 1, wherein the mask setting unit sets a mask that is enlarged at an arbitrary enlargement ratio from the reference mask and the quality evaluating unit counts the number of display points in the effective range based on the enlarged mask, measures the margin of the data signal for the reference mask on the basis of the number of display points in the enlarged mask and the number of display points in the reference mask, and displays the measurement result of the margin on the display unit.

4. The data signal quality evaluation apparatus according to claim 2, wherein the mask setting unit sets a mask that is enlarged at an arbitrary enlargement ratio from the reference mask and the quality evaluating unit counts the number of display points in the effective range based on the enlarged mask, measures the margin of the data signal for the reference mask on the basis of the number of display points in the enlarged mask and the number of display points in the reference mask, and displays the measurement result of the margin on the display unit.

5. A data signal quality evaluation apparatus comprising:

a waveform data acquiring unit (21) that performs sampling on a data signal to be evaluated to acquire waveform data of the data signal;

a display unit (40);

an eye pattern display unit (31) that displays an eye pattern of the data signal on the display unit on the basis of the waveform data acquired by the waveform data acquiring unit;

a mask setting unit (32) that sets a mask which has a polygonal shape substantially similar to a shape of a region surrounded by the eye pattern of the data signal and has a size corresponding to a bit rate and amplitude of the data signal as a reference mask for evaluating quality of the data signal;

a mask display unit (33) that sequentially displays the reference mask set by the mask setting unit and a mask enlarged at an arbitrary enlargement ratio at a desired position which overlaps the region surrounded by the eye pattern of the data signal; and a quality evaluating unit (34) that counts a number of display points in an effective range based on the reference mask and another number of display points in another effective range based on the enlarged mask, measures a margin of the data signal for the reference mask on the basis of the number of display points in the reference mask and the number of display points in the enlarged mask, and displays a measurement result of the margin on the display unit, wherein the quality evaluating unit has a real-time measurement mode (34b) in which, whenever the waveform data acquiring unit acquires a minimum number of data items required to display the eye pattern with a predetermined time width, the margin of the acquired data is measured.

6. The data signal quality evaluation apparatus according to claim 5, wherein the quality evaluating unit stores the measurement result of the margin while repeatedly performing the real-time measurement, thereby acquiring the measurement result of the margin corresponding to a predetermined number of data items in the measurement of the margin.

7. A data signal quality evaluation method comprising:

a waveform data acquiring step (S101) of performing sampling on a data signal to be evaluated which has a desired bit rate and a desired amplitude to acquire waveform data of the data signal;

an eye pattern display step (S102) of displaying an eye pattern of the data signal on the basis of the waveform data acquired in the waveform data acquiring step;

a mask setting step (S103) of setting a mask which has a polygonal shape substantially similar to a shape of a region surrounded by the eye pattern of the data signal and has a size corresponding to the bit rate and amplitude of the data signal as a reference mask for evaluating quality of the data signal;

a mask display step (S104) of displaying the reference mask set in the mask setting step at a desired position which overlaps a region surrounded by the eye pattern of the data signal;

a counting step (S105) of counting a number of display points in the region of the reference mask among the display points of the waveform data forming the eye pattern to determine a count value;

a quality evaluating step (S106) of evaluating the quality of the data signal on the basis of the count value and displaying an evaluation result of the quality; and a mask region limiting step (S107) of designating an arbitrary width and an arbitrary angle to an effective range of the reference mask, limiting the effective range of the reference mask to a range determined by the determined width and angle, and displaying the limited effective range, wherein the quality evaluating step performs the quality evaluation on the limited effective range.

8. The data signal quality evaluation method according to claim 7, wherein the mask region limiting step uses an overlap range between a region interposed between two parallel straight lines which are equidistant from the center of the reference mask and are inclined at a predetermined angle and the region of the reference mask as the effective range.

9. The data signal quality evaluation method according to claim 7, further comprising:

an enlargement ratio setting step (S108) of setting a mask that is enlarged at an arbitrary enlargement ratio from the reference mask, wherein the quality evaluating step is a margin measuring step (S109) of counting the number of display points in the effective range based on the enlarged mask, measuring the margin of the data signal for the reference mask on the basis of the number of display points in the enlarged mask and the number of display points in the reference mask, and displaying the measurement result of the margin.

10. The data signal quality evaluation method according to claim 8, further comprising:

an enlargement ratio setting step (S108) of setting a mask that is enlarged at an arbitrary enlargement ratio from the reference mask, wherein the quality evaluating step is a margin measuring step (S109) of counting the number of display points in the effective range based on the enlarged mask, measuring the margin of the data signal for the reference mask on the basis of the number of display points in the enlarged mask and the number of display points in the reference mask, and displaying the measurement result of the margin.

11. A data signal quality evaluation method comprising:
- a waveform data acquiring step (S101) of performing sampling on a data signal to be evaluated which has a desired bit rate and a desired amplitude to acquire waveform data of the data signal;
- an eye pattern display step (S102) of displaying an eye pattern of the data signal on the basis of the waveform data acquired in the waveform data acquiring step;
- a mask setting step (S103) of setting a mask which has a polygonal shape substantially similar to a shape of a region surrounded by the eye pattern of the data signal and has a size corresponding to the bit rate and amplitude of the data signal as a reference mask for evaluating the quality of the data signal;
- a mask display step (S104) of sequentially displaying the reference mask set in the mask setting step and a mask enlarged at an arbitrary enlargement ratio at a desired position which overlaps the region surrounded by the eye pattern of the data signal;
- a counting step (S105) of counting a number of display points in the region of the reference mask among the display points of the waveform data forming the eye pattern;
- an enlargement ratio setting step (S108) of setting a mask that is enlarged at an arbitrary enlargement ratio from the reference mask, instead of the reference mask,
- a margin measuring step (S109) of counting another number of display points in an effective range based on the enlarged mask, measuring a margin of the data signal for the reference mask on the basis of the number of display points in the reference mask and the another number of display points in the enlarged mask, and displaying a measurement result of the margin;
- a predetermined unit data acquiring step (S111) of acquiring a minimum number of data items required to display the eye pattern with a predetermined time width; and
- a real-time measurement mode (S112) that measures the margin of the acquired data whenever the minimum number of data items required to display the eye pattern with the predetermined time width is acquired.

12. The data signal quality evaluation method according to claim 11, further comprising:
- a margin measurement result storage step (S113) of storing the measurement result of the margin while repeatedly performing the real-time measurement,
- wherein the quality evaluating step includes a predetermined number measuring step (S114) of acquiring the measurement result of the margin corresponding to a predetermined number of data items in the measurement of the margin.

* * * * *